(12) United States Patent
Seshadri et al.

(10) Patent No.: US 11,742,426 B2
(45) Date of Patent: Aug. 29, 2023

(54) FORMING CROSSBAR AND NON-CROSSBAR TRANSISTORS ON THE SAME SUBSTRATE

(71) Applicant: International Business Machines Corporation, Armonk, NY (US)

(72) Inventors: Indira Seshadri, Niskayuna, NY (US); Ardasheir Rahman, Schenectady, NY (US); Ruilong Xie, Niskayuna, NY (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 20 days.

(21) Appl. No.: 17/316,832

(22) Filed: May 11, 2021

(65) Prior Publication Data
US 2022/0367700 A1 Nov. 17, 2022

(51) Int. Cl.
*H01L 29/78* (2006.01)
*H01L 21/8238* (2006.01)
*H01L 29/66* (2006.01)

(52) U.S. Cl.
CPC .... *H01L 29/785* (2013.01); *H01L 21/823821* (2013.01); *H01L 29/6656* (2013.01); *H01L 29/66795* (2013.01)

(58) Field of Classification Search
CPC ........... H01L 29/785; H01L 21/823821; H01L 29/6656; H01L 229/66795; H01L 7/1211; H01L 21/845; H01L 27/10879; H01L 29/66795–66818
See application file for complete search history.

(56) References Cited

U.S. PATENT DOCUMENTS

| 10,083,877 | B1 | 9/2018 | Sano et al. |
| 10,340,364 | B2 | 7/2019 | Zhang et al. |
| 2007/0045686 | A1* | 3/2007 | Cheng ..................... G11C 11/15 257/295 |
| 2007/0284623 | A1 | 12/2007 | Kim et al. |
| 2015/0249039 | A1* | 9/2015 | Shieh .............. H01L 21/823431 438/702 |
| 2019/0198572 | A1 | 6/2019 | Ando et al. |
| 2019/0198669 | A1 | 6/2019 | Park et al. |
| 2019/0287863 | A1 | 9/2019 | Xie et al. |

* cited by examiner

*Primary Examiner* — Cuong B Nguyen
(74) *Attorney, Agent, or Firm* — CANTOR COLBURN LLP; Samuel Waldbaum (57) ABSTRACT

A method of forming a transistor structure is provided. The method includes forming on a substrate first and second mandrels for forming two-dimensional (2D) transistor fin elements defining a pitch gap region, depositing and anisotropically etching back the first spacer material to form first and second spacers in and around the first and second mandrels, respectively, conformally depositing and anisotropically etching back second spacer material around the first and second spacers and in the pitch gap region to define space for forming an odd number of one-dimensional (1D) transistor fin elements in the pitch gap region and depositing and anisotropically etching back the first spacer material in the space with enough cycles to fill the space to form a third spacer.

6 Claims, 6 Drawing Sheets

FORMING CROSSBAR AND NON-CROSSBAR TRANSISTORS ON THE SAME SUBSTRATE

BACKGROUND

The present invention generally relates to transistors. More specifically, the present invention relates to fabrication operations and resulting structures for crossbar field effect transistors (FETs) and non-crossbar (or regular) FETs.

Integrated circuits (ICs), such as microprocessors, storage devices, etc., often include millions of circuit elements including structures such as transistors. Transistors come in a variety of shapes and forms, e.g., planar, fin-type, nanowire, etc. Irrespective of its physical configuration, each transistor includes source/drain regions and a gate structure defining a channel positioned between the source/drain regions. When a predetermined control voltage is applied to the gate structure, the portion of the channel in contact with the gate structure and between the source/drain regions becomes conductive. The transistors are generally either an N-type (NFET) or P-type (PFET) transistor device wherein the "N" and "P" indicate the type of dopants used to create the source/drain regions of the devices.

As discussed above, transistors come in a variety of shapes and forms. One conventional type of transistor includes a two-dimensional field effect transistor (FET), for example, a planar type transistor in which current flows through the channel region in a substrate between source/drain regions in/on the substrate adjacent to the channel. To provide better control of the current flow, three-dimensional (or non-planar) transistor structures are becoming more commonly used as opposed to conventional two-dimensional (or planar) transistors. In some three-dimensional transistors, the substantially planar (i.e., two dimensional) channel described with respect to the planar FET is replaced by a substantially non-planar (or three dimensional) fin structure that extends outward, normal to the substrate surface and between source/drain regions. Generally, in fin-based three-dimensional transistors, the gate structure that controls current flow in the fin wraps around three sides of the fin (or around all four sidewalls of the fin) to influence the current flow from three surfaces instead of one as in planar FETs. As a result, three-dimensional transistors can exhibit faster switching performance and reduced current leakage, which contribute to improving overall transistor performance.

In another type of three-dimensional transistor referred to as gate-all-around (GAA) FETs, the channel is formed as a series of stacked and spaced apart nanosheets (or nanowires), and the gate structure surrounds all sides of the channel nanosheets/nanowires in order to influence the current flow from every direction. GAA FETs can enable reduced short channel effects (SCE) and provide an overall increase in transistor performance.

SUMMARY

Embodiments of the present invention are directed to a method of forming a transistor structure. A non-limiting example of the method includes forming on a substrate first and second mandrels for forming two-dimensional (2D) transistor fin elements defining a pitch gap region, depositing and anisotropically etching back the first spacer material to form first and second spacers in and around the first and second mandrels, respectively, conformally depositing and anisotropically etching back second spacer material around the first and second spacers and in the pitch gap region to define space for forming an odd number of one-dimensional (1D) transistor fin elements in the pitch gap region and depositing and anisotropically etching back the first spacer material in the space with enough cycles to fill the space to form a third spacer.

Embodiments of the present invention are directed to a transistor structure. A non-limiting example of the transistor structure includes a substrate having first and second portions and a third portion interposed between the first and second portions, first and second two-dimensional (2D) transistor fin elements extending upwardly from the first and second portions of the substrate and an odd number of one-dimensional (1D) transistor fin elements extending upwardly from the third portion of the substrate.

Embodiments of the invention are directed to a precursor structure formed during formation of a transistor structure. A non-limiting example of the precursor structure includes a first hard mask disposed on a substrate and a second hard mask disposed on the first hard mask to form first and second mandrels defining a pitch gap region between the first and second mandrels. The precursor structure further includes first spacer material deposited on the first hard mask in and around the first and second mandrels to assume shapes of two-dimensional (2D) transistor fin elements and second spacer material conformally deposited in the pitch gap region to define space having a shape of a one-dimensional (1D) transistor fin element.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One challenge associated with GAA FETs includes scaling of the channel(s). Conventional channel layouts require balancing of competing parameters of the channel (e.g., width (a.k.a., footprint), thickness, and perimeter (a.k.a., effective width, Weff)), generally at the expense of one or more of those parameters. For example, in order to increase the perimeter of a channel, the width and/or thickness of the channel can need to be increased beyond a desirable value. Increasing width and/or thickness of the channel can decrease the distance between adjacent channels, and increase the risk of electrical shorts between the structures. Increasing the thickness and/or the width of the channel can also reduce the number of channels that can be formed in a defined region of the semiconductor structure. In another example, increasing the thickness of a channel can contribute to channel bending, and decreased stability. Reducing the perimeter of a channel can also reduce the surface area of the channel in contact with the gate structure and reduce performance of the channel.

Turning now to an overview of technologies that are more specifically relevant to aspects of the invention, crossbar-shaped fins or H-shaped fins of an FET are a Weff booster at small fin lengths for vertical transistor FET (VTFET) scaling. In these cases, the bar in between the parallel fins effectively increases a total length of the FET.

While the formation of crossbar-shaped or H-shaped fins of FETs provide for Weff boosting, prior or conventional processes typically require certain design rule restrictions that are not necessarily optimized for certain applications. Thus, the advantages of crossbar-shaped or H-shaped fins of FETs might not be fully realized. In particular, certain formation processes require that all of the FETs in a given device are crossbar-shaped or H-shaped fins or require a combination of crossbar-shaped or H-shaped fins with an even number of straight fins. Indeed, there are no available processes for cell formation for those applications that call for a certain level of cell compression and an odd number of straight fins between crossbar-shaped or H-shaped fins.

Turning now to an overview of the aspects of the invention, one or more embodiments of the invention address the above-described shortcomings of the prior art by providing a cell formation structure in which two-dimensional or 2D fins, such as crossbar-shaped fins or H-shaped fins, of an FET are disposed on either side of an odd number of one-dimensional or 1D fins, such as straight fins, wherein the 1D fins have a different critical dimension (CD) from the 2D fins. This leads to an increased level of cell compression for the cell formation structure.

The above-described aspects of the invention address the shortcomings of the prior art by providing a structure and a method. The structure includes 2D fins and an odd number of 1D fins, where the 1D fins can have the same or different fin CDs than the 2D fins. The method includes forming crossbar and straight fin mandrels with a pitch gap in an odd numbered straight fin region, executing conformal deposition of a thick spacer over a crossbar hard mask, such that space between thick spacers equals a fin CD and filling the pitch gap with hard mask material to form or define the odd numbered 1D fin(s).

Figure 1:
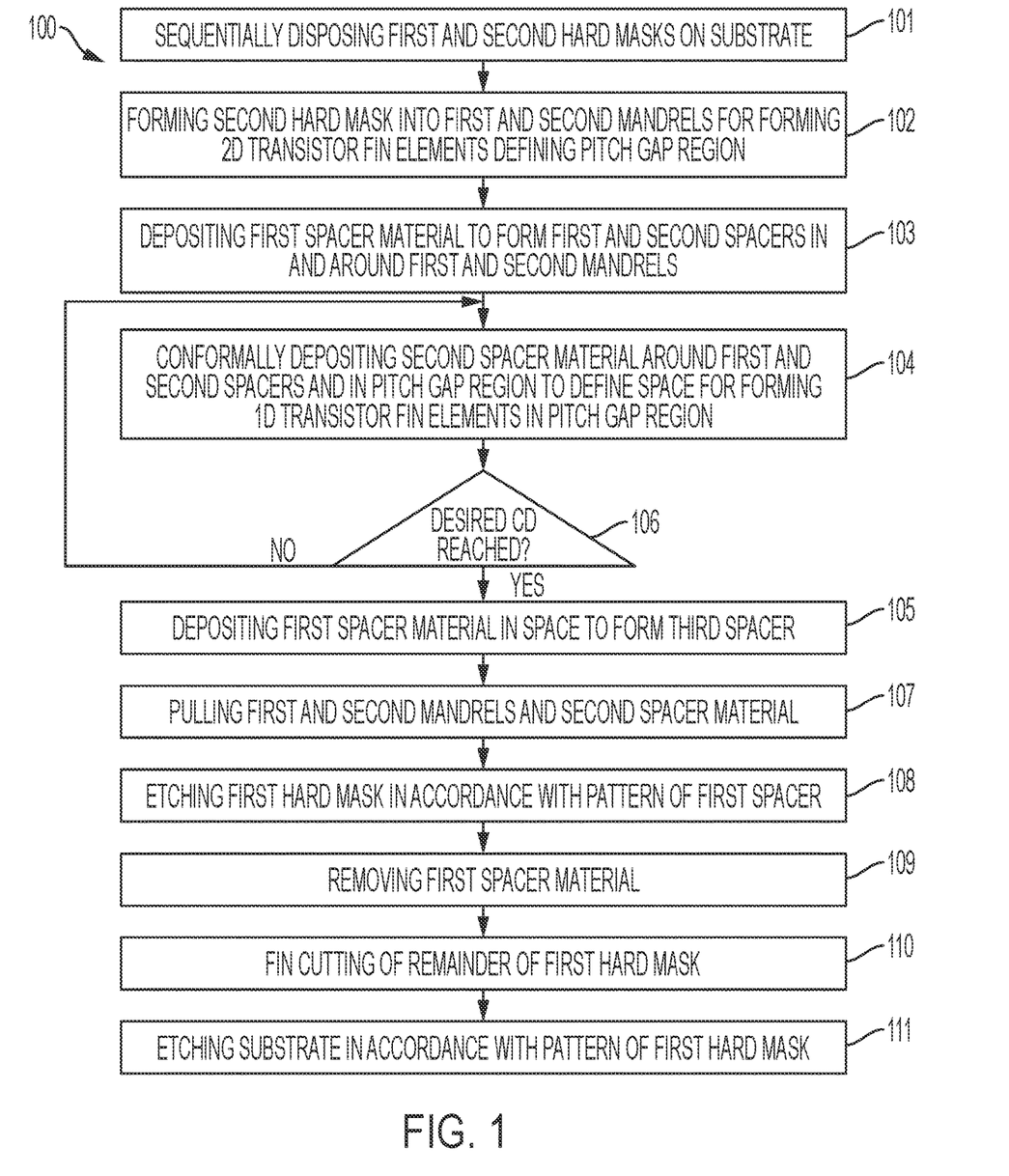
FIG. 1 is a flow diagram illustrating a method of simultaneously forming crossbar-shaped fins and regular fins of field effect transistors (FETs) in accordance with one or more embodiments of the present invention.

Turning now to a more detailed description of aspects of the present invention, FIG. 1 is a flow diagram illustrating a method 100 that can be used to form a transistor structure in accordance with embodiments of the invention is provided. The method 100 includes sequentially disposing first and second hard masks on a substrate (i.e., a semiconductor substrate) 101. The method 100 also includes forming the second hard mask into first and second mandrels for forming two-dimensional (2D) transistor fin elements defining a pitch gap region 102, depositing first spacer material to form first and second spacers in and around the first and second mandrels, respectively 103 and conformally depositing second spacer material around the first and second spacers and in the pitch gap region to define space for forming an odd number of one-dimensional (1D) transistor fin elements in the pitch gap region 104. In addition, the method 100 can include depositing the first spacer material in the space to form a third spacer 105.

As used herein, the term "one-dimensional" or "1D" is used in context to refer to a straight transistor fin element with a critical dimension (CD) in its width dimension define perpendicular to a long dimension of the straight transistor fin element. The term "two-dimensional" or "2D" is used in context to refer to a transistor fin element that has a crossbar-shape or an H-shape with a critical dimension in its width dimension. The CD of each of the 1D transistor fin element(s) correspond to the CD of each of the 2D transistor film element(s).

In accordance with one or more embodiments of the present invention, the first and second hard masks are formed of different hard mask materials and the second spacer material differs from the first spacer material. In some cases, the second spacer material can be a same material as that of the second hard mask. That is, the second spacer material can be a nitride, such as silicon nitride, and the first spacer material can be an oxide, such as silicon dioxide.

The conformal deposition of the second spacer material of operation 104 can be executed such that a CD of the space differs from a corresponding CD of the 2D transistor fin elements and/or is controlled to arrive at a predefined CD of the space. As such, the method 100 can further include determining whether a desired CD of the space has been reached 106 prior to the depositing of the first spacer material of operation 105. In an event the desired CD has not been reached, the method 100 can include a continued conformal deposition of the second spacer material of operation 104 followed by an anisotropic etchback to remove the spacer material from the bottom and top horizontal surfaces.

In accordance with one or more additional embodiments of the present invention, the method 100 can include pulling the first and second mandrels and the second spacer material 107, etching the first hard mask in accordance with a pattern of the first spacer material 108, removing the first spacer material 109, fin cutting of a remainder of the first hard mask 110 and etching the substrate in accordance with the pattern of the first hard mask 111.

The various operations of the method 100 of FIG. 1 will be described in greater detail below with reference to FIGS. 2 and 3 and with reference to FIGS. 4-16.

Figure 2:
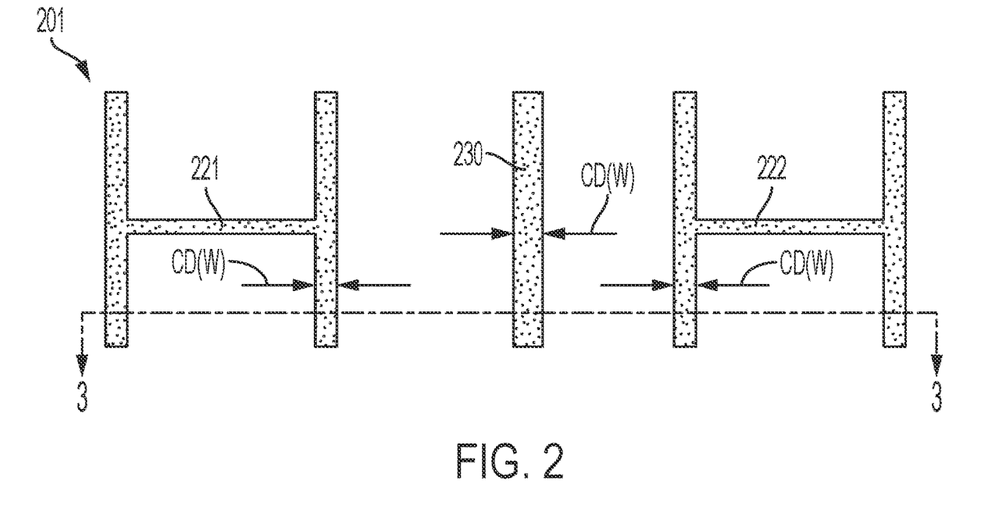
FIG. 2 is a top-down view of a transistor structure having first and second two-dimensional (2D) fins and an odd number of one-dimensional (1D) fins in accordance with one or more embodiments of the present invention.
Figure 3:
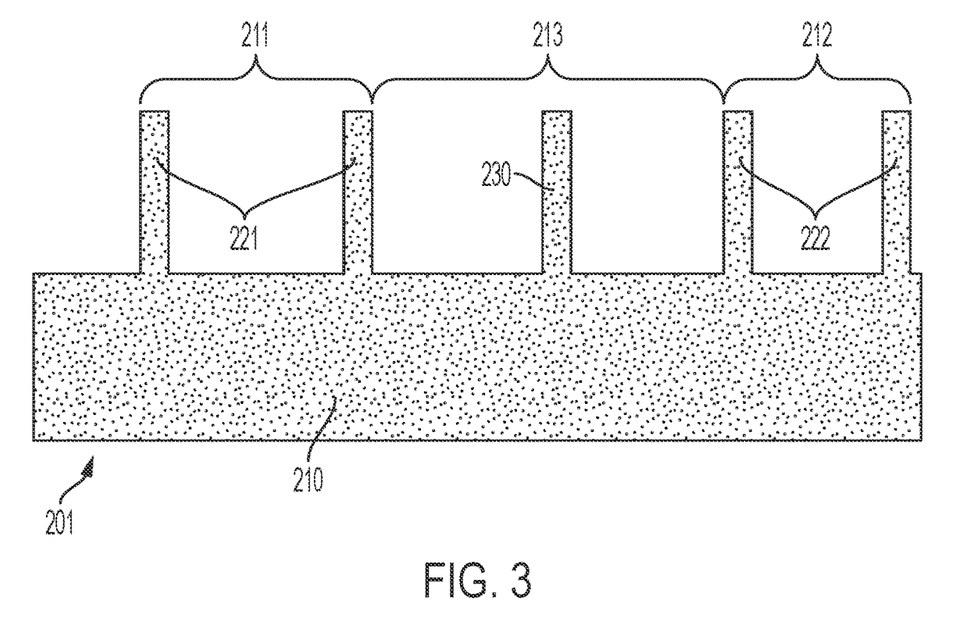
FIG. 3 is a cross-sectional view of the transistor structure of FIG. 2 taken along line 3-3 in accordance with one or more embodiments of the present invention.

With reference to FIGS. 2 and 3, a transistor structure 201 is shown after fabrication operations according to embodiments of the invention. More specifically, FIG. 2 depicts a top-down view of the structure 201, and FIG. 3 depicts a cross-sectional of the structure 201 taken along line 3-3 of FIG. 2. As best shown in FIG. 3, the transistor structure 201 includes a substrate 210 having first and second portions 211 and 212 and a third portion 213 interposed between the first and second portions 211 and 212. The transistor structure 201 further includes multiple first 2D fin elements 221, multiple second 2D transistor fin elements 222, and an odd number (e.g., one) of 1D transistor fin elements 230. The first 2D transistor fin elements 221 extends upwardly from the first portion 211 of the substrate 210. The second 2D transistor fin elements 222 extends upwardly from the second portion 212 of the substrate 210. Each 1D transistor fin element 230 extends upwardly from the third portion 213 of the substrate 210. A CD of each 1D transistor fin element 230 differs from a CD of each of the first and second 2D transistor fin elements 221, 222. In embodiments of the invention, the multiple first 2D transistor fin elements 221 are arranged in a crossbar-shape or an H-shape, and the multiple second 2D transistor fin elements 222 are arranged in a crossbar-shape or H-shape. In embodiments of the invention, each 1D transistor fin element 230 is in the shape of single high-aspect ratio bar having substantially straight sidewalls, as shown.

In accordance with embodiments of the invention, only a single 1D transistor fin element 230 extends upwardly from the third portion 213 of the substrate 210 although it is to be understood that this is not required and that other embodiments of the invention exist in which multiple 1D transistor fin elements 230 extend upwardly from the third portion 213 of the substrate 210. For the purposes of clarity and brevity, the following description will generally relate to the case of a single 1D transistor fin element 230.

The substrate 210 can include a bulk semiconductor layer, a semiconductor-on-insulator (SOI) substrate, etc., and can include any currently known or later developed semiconductor material, which can include without limitation, silicon, germanium, silicon carbide, and those including one or more III-V compound semiconductors and one or more II-VI compound semiconductors. An entirety of the substrate 210 or a portion thereof can be strained or otherwise formed by deposition and/or wafer bonding. In embodiments of the invention, the first and second 2D transistor fin elements 221, 222 and the 1D transistor fin element 230 can be formed of the same or substantially the same material as the substrate 210.

With reference to FIGS. 4-16, the method 100 of forming a transistor structure as described above with reference to FIG. 1 in order to arrive at the transistor structure 201 of FIG. 2 will now be described.

Figure 4:
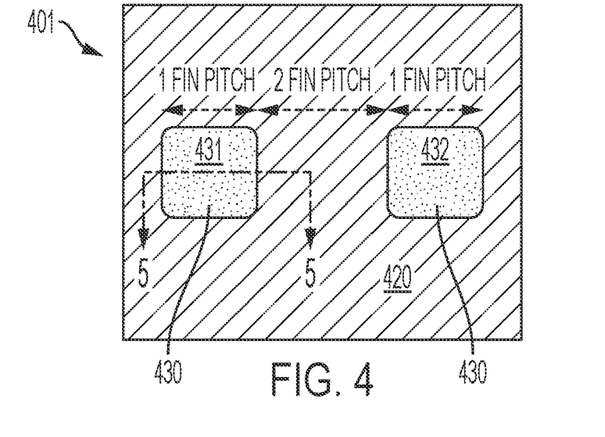
FIG. 4 is a top-down view of a precursor structure of a transistor structure with crossbar mandrels in accordance with one or more embodiments of the present invention.
Figure 5:
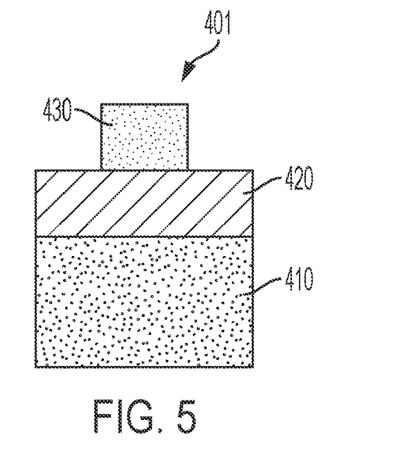
FIG. 5 is a cross-sectional view of the precursor structure of FIG. 4 taken along line 5-5 in accordance with one or more embodiments of the present invention.

With reference to FIGS. 4 and 5, a precursor structure 401 is shown after an initial set of fabrication operations in accordance with aspects of the invention. More specifically, FIG. 4 depicts a top down view of the structure 401, and FIG. 5 depicts a cross-sectional view of the structure 401 taken along line 5-5 of FIG. 4. As best shown in FIG. 5, the structure 401 includes a substrate 410, a first hard mask 420 that is formed of first hard mask material, such as a nitride, and a second hard mask 430 that is formed of second hard mask material, such as a nitride that differs from the nitride of the first hard mask material. The first and second hard masks 420 and 430 can be formed by depositional processes or other similar processes. The second hard mask 430 can be initially formed with same dimensions as the first hard mask 420 and the substrate 410 but can be paired down into first and second crossbar mandrels 431 and 432. Each of the first and second crossbar mandrels 431 and 432 can have one-fin pitch width dimensions and a separation between the first and second crossbar mandrels 431 and 432. The separation defines a pitch gap region 433 having a two-fin pitch width dimension.

Figure 6:
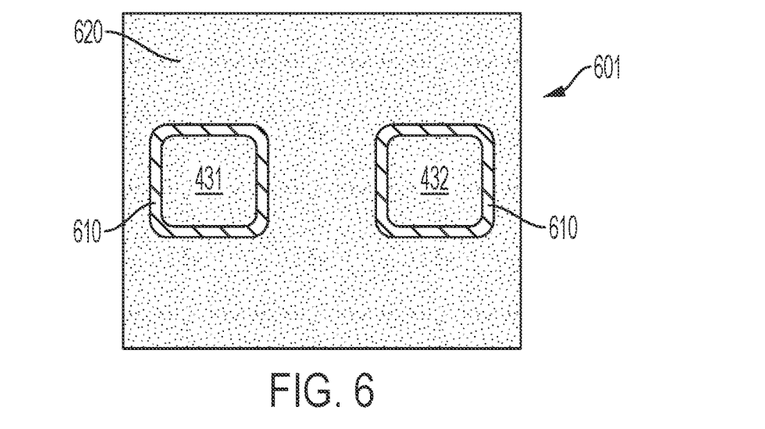
FIG. 6 is a top-down view of a secondary precursor structure of a transistor structure with spacer material deposited around the crossbar mandrels of FIG. 4 and crossbar mandrel material deposited about the spacer material in accordance with one or more embodiments of the present invention.

With reference to FIG. 6, a top down view of a secondary precursor structure 601 is shown after fabrication operations in accordance with embodiments of the invention. The structure 601 includes the precursor structure 401 of FIGS. 4 and 5 with first spacer material 610 deposited around the first and second crossbar mandrels 431 and 432 and crossbar mandrel material 620 deposited about the spacer material 610. The crossbar mandrel material 620 differs from the first spacer material 610 and can be a same material as the second hard mask material.

Figure 7:
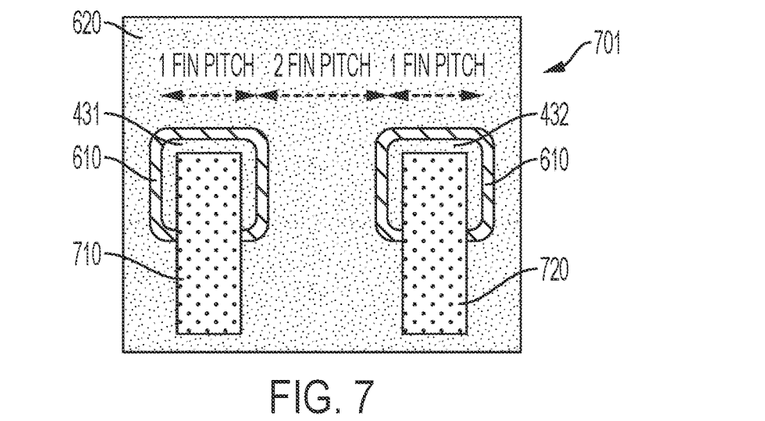
FIG. 7 is a top-down view of another secondary precursor structure of a transistor structure with a patterned trilayer stack deposited on the crossbar mandrels, the spacer material and the crossbar mandrel material of FIG. 6 in accordance with one or more embodiments of the present invention.

With reference to FIG. 7, a top down view of another secondary precursor structure 701 is shown after fabrication operations in accordance with embodiments of the invention. The structure 701 includes the secondary precursor structure 601 of FIG. 6 and is formed as a result of a trilayer stack deposition and etch process resulting in first and second patterned trilayer stacks 710 and 720. The first and second patterned trilayer stacks 710 and 720 are thus deposited on portions of the first and second crossbar mandrels 431 and 432, respectively, portions of the first spacer material 610 and portions of the crossbar mandrel material 620.

Figure 8:
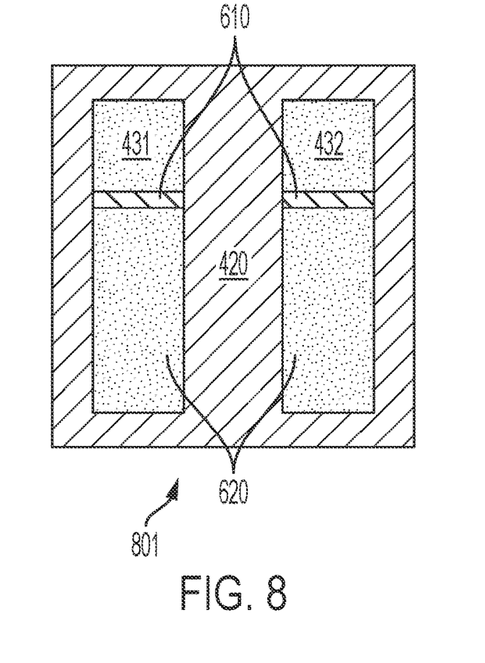
FIG. 8 is a top-down view of an intermediate precursor structure of a transistor structure following a non-selective etch of the spacer material and the crossbar mandrel material of FIG. 7 and a removal of the trilayer stack of FIG. 7 in accordance with one or more embodiments of the present invention.

With reference to FIG. 8, a top down view of an intermediate precursor structure 801 is shown after fabrication operations in accordance with embodiments of the invention. The intermediate precursor structure 801 results from a non-selective etch of the first spacer material 610 and portions of the crossbar mandrel material 620 exposed by the first and second trilayer stacks 710 and 720 and a subsequent removal of the first and second trilayer stacks 710 and 720 of FIG. 7.

Figure 9:
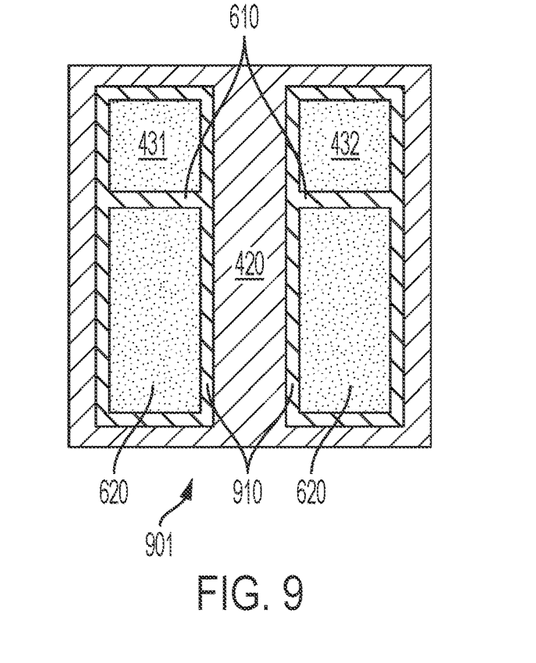
FIG. 9 is a top-down view of another intermediate precursor structure of a transistor structure following deposition of spacer material about the crossbar mandrels and remaining spacer and crossbar mandrel material in accordance with one or more embodiments of the present invention.

With reference to FIG. 9, a top down view of another intermediate precursor structure 901 is shown after fabrication operations in accordance with embodiments of the invention. The structure 901 results from deposition of first spacer material 910 about the first and second crossbar mandrels 431 and 432 and about remaining first spacer material 610 and remaining crossbar mandrel material 620. The remaining first spacer material 610 and the first spacer material 910 at each of the first and second crossbar mandrels 431 and 432 assume shapes of 2D transistor fin elements.

Figure 10:
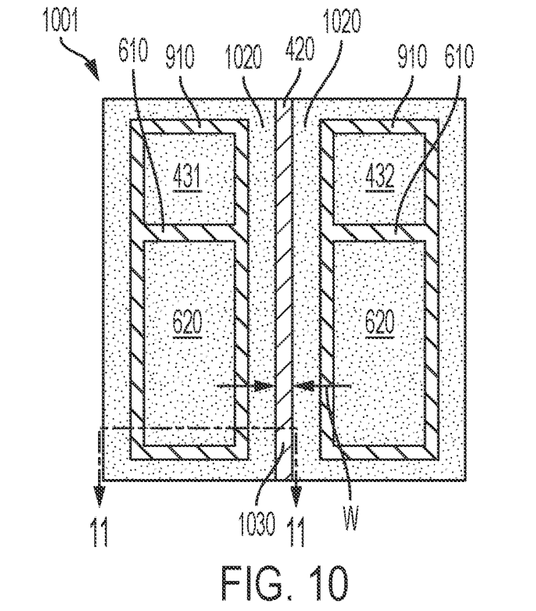
FIG. 10 is a top-down view of yet another intermediate precursor structure of a transistor structure following conformal deposition of thick spacer material about the spacer material of FIG. 9 in accordance with one or more embodiments of the present invention.
Figure 11:
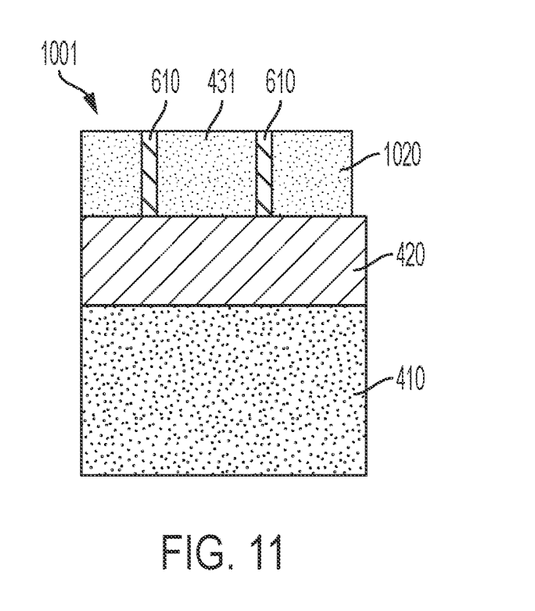
FIG. 11 is a cross-sectional view of the intermediate precursor structure of FIG. 10 taken along line 11-11 in accordance with one or more embodiments of the present invention.

With reference to FIGS. 10 and 11, yet another intermediate precursor structure 1001 is provided and results from conformal deposition of thick spacer material 1020 about the first spacer material 910 of FIG. 9. More specifically, FIG. 10 depicts a top down view of the precursor structure 1001, and FIG. 11 depicts a cross-sectional view of the precursor structure 1001 taken along line 11-11 of FIG. 10. As best shown in FIG. 11, the intermediate precursor structure 1001 includes the substrate 410 and the first hard mask 420. The intermediate precursor structure 1001 further includes the first and second crossbar mandrels 431 and 432, the remaining first spacer material 610 and the crossbar mandrel material 620 at each of the first and second crossbar mandrels 431 and 432 and the first spacer material 910. The remaining first spacer material 610 and the first spacer material 910 at each of the first and second crossbar mandrels 431 and 432 assume the shapes (e.g., crossbar-shapes or H-shapes) of the 2D transistor fin elements. The thick spacer material 1020 can be a same material as the crossbar mandrel material 620. The conformal deposition of the thick spacer material 1020 causes the thick spacer material 1020 to grow inwardly from the interior oppositely facing sides of the first spacer material 910 and thus forms a space 1030.

The space 1030 has a shape of the 1D transistor fin element and a width W that defines the CD of the 1D transistor fin element.

The conformal deposition of the thick spacer material 1020 is continued until the width W reaches a desired CD, which can be any one of various widths and can be different from a corresponding CD of the 2D transistor fin elements. The deposition of each spacer material is followed by an etchback process to remove it from the bottom and top horizontal surfaces.

Figure 12:
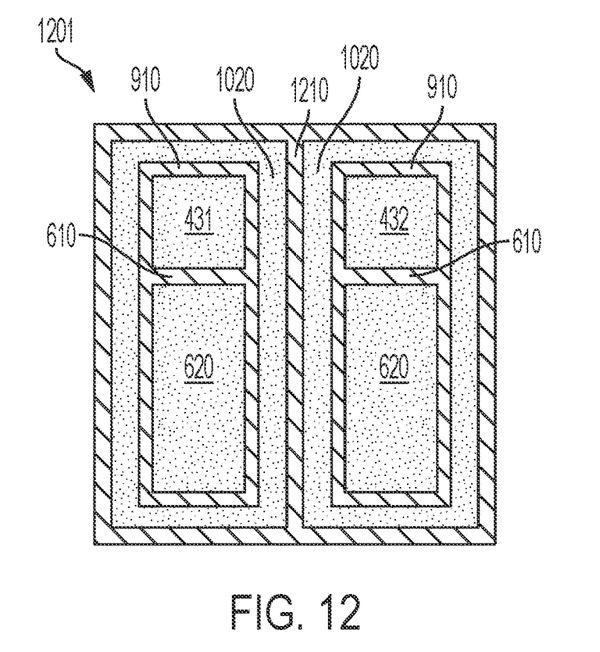
FIG. 12 is a top-down view of a late stage precursor structure of a transistor structure following deposition of an odd fin spacer between the thick spacer material of FIG. 10 in accordance with one or more embodiments of the present invention.

With reference to FIG. 12, a top down view of a late stage precursor structure 1201 is shown after fabrication operations in accordance with embodiments of the invention. The structure 1201 results from deposition and an etching back of odd fin spacer material 1210 on the first hard mask 420 in the space 1030 between the thick spacer material 1020 of FIG. 10. The odd fin spacer material 1210 can be a same spacer material as the remaining first spacer material 610 and the first spacer material 910.

Figure 13:
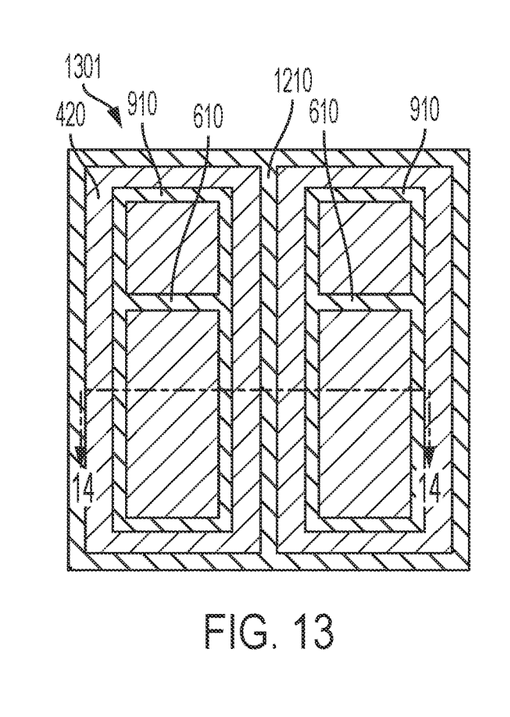
FIG. 13 is a top-down view of another late stage precursor structure of a transistor structure following a mandrel pull executed with respect to the crossbar mandrels and the crossbar mandrel materials of FIG. 12 in accordance with one or more embodiments of the present invention.
Figure 14:
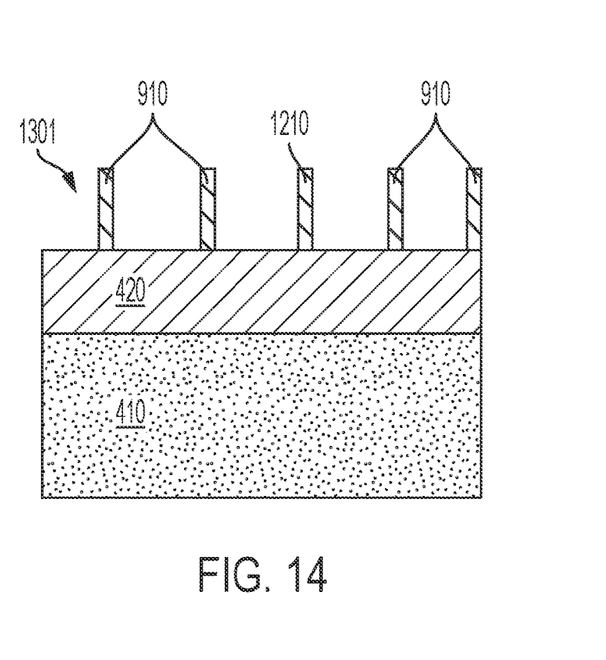
FIG. 14 is a cross-sectional view taken along line 14-14 of FIG. 13 in accordance with one or more embodiments of the present invention.

With reference to FIGS. 13 and 14, another late stage precursor structure 1301 is provided. More specifically, FIG. 13 depicts a top down view of the late stage precursor structure 1301, and FIG. 14 depicts a cross-sectional view of the late stage precursor structure 1301 taken along line 14-14 of FIG. 13. As best shown in FIG. 13, the late stage precursor structure 1301 results from a mandrel pull executed with respect to the first and second crossbar mandrels 431 and 432 and the crossbar mandrel materials 620 of FIG. 12.

Figure 15:
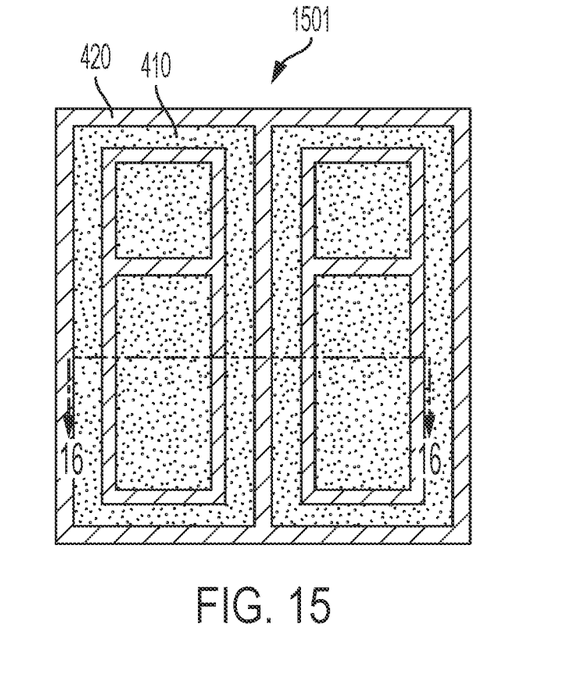
FIG. 15 is a top-down view of yet another late stage precursor structure of a transistor structure following a hard mask etch and fin cuts in accordance with one or more embodiments of the present invention.
Figure 16:
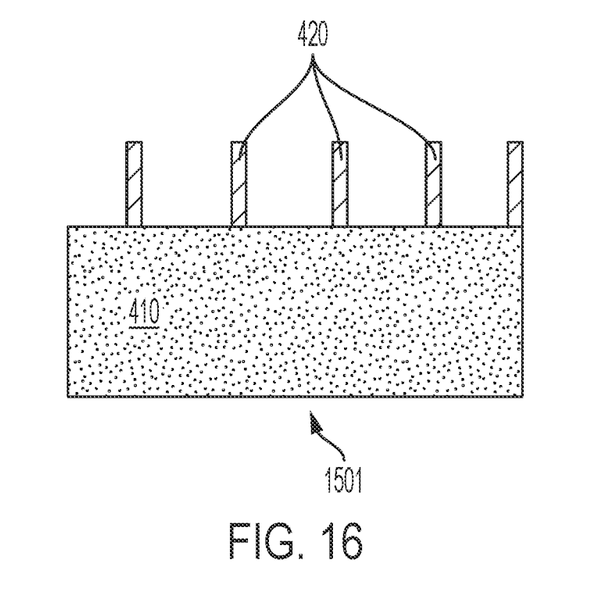
FIG. 16 is a cross-sectional view taken along line 16-16 of FIG. 15 in accordance with one or more embodiments of the present invention.

With reference to FIGS. 15 and 16, yet another late stage precursor structure 1501 is provided. More specifically, FIG. 15 depicts a top down view of the late stage precursor structure 1501, and FIG. 16 depicts a cross-sectional view of the late stage precursor structure 1501 taken along line 16-16 of FIG. 15. The late stage precursor structure 1501 results from a hard mask etch executed with respect to the portions of the first hard mask 420 that are exposed by the remaining first spacer material 610, the first spacer material 910 and the odd fin spacer material 1210 of FIG. 14. Subsequent fin cuts to remove mandrel loops and unwanted fin portions and then silicon etch processes can be executed to arrive at the transistor structure 201 of FIGS. 2 and 3.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 5% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a transistor structure, the method comprising:
    forming on a substrate first and second mandrels for forming two-dimensional (2D) transistor fin elements defining a pitch gap region;
    depositing and anisotropically etching back first spacer material to form a first spacer around the first mandrel and to form a second spacers around the second mandrel;
    conformally depositing and anisotropically etching back second spacer material around the first and second spacers and in the pitch gap region to define space for forming an odd number of one-dimensional (1D) transistor fin elements in the pitch gap region; and
    cyclically depositing and anisotropically etching back the first spacer material in the space to fill the space to form a third spacer,
    wherein the conformally depositing of the second spacer material is executed such that a critical dimension (CD) of the space differs from a corresponding CD of the 2D transistor fin elements.

2. The method according to claim 1, wherein the substrate comprises a first hard mask and a second hard masks formed of different hard mask materials and the second spacer material differs from the first spacer material.

3. The method according to claim 2, wherein the second spacer material is a same material as that of the second hard mask.

4. The method according to claim 1, wherein the conformally depositing of the second spacer material is controlled to arrive at a predefined critical dimension (CD) of the space.

5. The method according to claim 1 further comprising pulling the first and second mandrels and the second spacer material.

6. The method according to claim 5 further comprising:
    etching a first hard mask in accordance with a pattern of the first spacer material;
    removing the first spacer material;
    fin cutting of a remainder of the first hard mask; and
    etching the substrate in accordance with the a pattern of the first hard mask.

* * * * *